(12) United States Patent
Delahaye

(10) Patent No.: US 7,943,526 B2
(45) Date of Patent: May 17, 2011

(54) PROCESS FOR THE WET-CHEMICAL TREATMENT OF ONE SIDE OF SILICON WAFERS

(75) Inventor: Franck Delahaye, Vörstetten (DE)

(73) Assignee: Rena Sondermaschinen GmbH, Gütenbach (DE)

( * ) Notice: Subject to any disclaimer, the term of this patent is extended or adjusted under 35 U.S.C. 154(b) by 402 days.

(21) Appl. No.: 10/599,208

(22) PCT Filed: Mar. 22, 2004

(86) PCT No.: PCT/DE2004/000597
§ 371 (c)(1),
(2), (4) Date: Sep. 22, 2006

(87) PCT Pub. No.: WO2005/093788
PCT Pub. Date: Oct. 6, 2005

(65) Prior Publication Data
US 2008/0233760 A1    Sep. 25, 2008

(51) Int. Cl.
*H01L 21/302* (2006.01)

(52) U.S. Cl. ........ 438/753; 438/745; 438/747; 438/750; 216/83; 216/84

(58) Field of Classification Search .................. 438/745, 438/747, 750, 753; 216/83, 84
See application file for complete search history.

(56) References Cited

U.S. PATENT DOCUMENTS

| 4,004,045 A | 1/1977 | Stelter |
| 5,270,079 A | 12/1993 | Bok |
| 5,601,655 A | 2/1997 | Bok et al. |
| 5,660,642 A | 8/1997 | Britten |
| 5,690,755 A * | 11/1997 | Yoshinaga et al. ............ 148/533 |
| 5,839,460 A * | 11/1998 | Chai et al. ...................... 134/147 |
| 6,015,462 A * | 1/2000 | Doolittle ........................ 118/668 |
| 6,306,224 B1 * | 10/2001 | Wandel et al. ................. 134/32 |
| 6,391,145 B1 * | 5/2002 | Nishimoto et al. ...... 156/345.12 |
| 6,412,500 B1 * | 7/2002 | Brunner et al. ............. 134/64 R |
| 6,506,260 B1 * | 1/2003 | Hiraishi et al. ................. 134/15 |
| 2001/0029978 A1 | 10/2001 | Nakai et al. |
| 2003/0194497 A1* | 10/2003 | Takada et al. ................. 427/355 |
| 2004/0020905 A1* | 2/2004 | Song et al. ............... 219/121.68 |

FOREIGN PATENT DOCUMENTS

| EP | 0496899 A1 | 8/1992 |
| EP | 1073095 A2 | 1/2001 |
| EP | 1184091 A1 | 3/2002 |
| JP | 49-107480 | 10/1974 |
| JP | 03-229680 | 10/1991 |
| JP | 09-321010 | 12/1997 |
| TW | 404853 | 9/2000 |
| WO | 99/17344 A | 4/1999 |
| WO | WO 0072220 A2 | 2/2000 |

OTHER PUBLICATIONS

International Search Report Issued in the Corresponding Application PCT/DE2004/000597, Completed Aug. 11, 2004 and Mailed Aug. 8, 2004.

* cited by examiner

*Primary Examiner* — Nadine Norton
*Assistant Examiner* — Maki A Angadi
(74) *Attorney, Agent, or Firm* — Biotech Beach Law Group PC; Raymond Wagenknecht

(57) ABSTRACT

The present invention relates in general terms to the treatment or processing of substrate surfaces. In particular, the invention relates to processes for modifying the surface of silicon wafers.

27 Claims, 1 Drawing Sheet

PROCESS FOR THE WET-CHEMICAL TREATMENT OF ONE SIDE OF SILICON WAFERS

This is a National Phase Application in the United States of International Patent Application No. PCT/DE2004/000597 filed Mar. 22, 2004. The entire disclosure of the above patent application is hereby incorporated by reference.

TECHNICAL FIELD

The present invention relates in general terms to the treatment or processing of substrate surfaces. In particular, the invention relates to processes for modifying the surface of silicon wafers.

BACKGROUND ART

During the production of silicon slices, silicon plates or wafers for the semiconductor and solar cell industry, the wafers are subjected to a range of mechanical and/or chemical treatment steps in order to impart the desired sizes and product properties to them. The text which follows describes the process steps for producing solar cells which are customary according to the prior art.

First of all, a silicon ingot is cut into slices, also known as wafers, using a wire saw. After they have been cut, the wafers are cleaned in order to remove what is known as a sawing slurry. This is generally followed by a wet-chemical saw damage etch using suitable chemicals, such as in particular lyes, in order to remove the defect-rich layer which results from the cutting process. The wafers are then washed and dried.

The wafers or substrates are generally monocrystalline or polycrystalline silicon wafers which are p-doped with boron. To produce a p n junction required for the solar cell to function, one side of the silicon wafers is n-doped. This n-doping is usually carried out by means of phosphorus doping. In the process, the substrate or silicon surface is modified by the incorporation of phosphorus atoms, the phosphorus source used generally being a gas or a liquid-pasty composition. After suitable incubation or coating of the silicon wafers in the gas or with the composition, the phosphorus atoms diffuse into, accumulate on or are incorporated into the silicon surface by heating to usually 800 to 1000° C. After this phosphorus doping, the silicon plate has a layer which is up to a few μm thick and is $n^+$-doped with phosphorus.

One problem with this surface modification is that generally not only the desired surface (top side) but also the opposite surface (underside) and in particular the peripheral edges of the substrate waters are modified or doped by the treatment, which in subsequent use leads to the risk of short circuits, since the edges are electrically conductive. Additional doping of the underside, as is effected for example by vapor phase doping, however, is in many cases acceptable, since the $n^+$ doping of the undersides or back surfaces of the plates is then generally converted into a p doping, as is required, for example, for the subsequent contact-connection of a solar cell, by the formation of an "aluminum back surface field". However, wafers which have been treated in this manner always have edges which include phosphorus atoms and are therefore electrically conductive, which without further treatment leads to silicon wafers having the abovementioned drawback of a risk of short circuits forming in subsequent use.

The prior art has developed various processes for eliminating this problem. By way of example, the problem of the electrically conductive edges is solved by the edges being ground away mechanically. However, the grinding, like the sawing, can produce detects in the crystal structure, leading to electrical losses. However, the main drawback of this procedure consists in the considerable risk of the sensitive wafers breaking.

Furthermore, it is proposed that the conductive layer which is present on the underside or back surface be interrupted in the outer region or at the edge by the action of a laser beam. However, this edge isolation by means of a laser is not yet an established process and throws up problems in particular with regard to the automation of the process and the throughput which can be achieved. Furthermore, there is a risk that subsequent process steps and the efficiency of, for example, a correspondingly produced cell may be adversely affected by accumulation of combustion products formed during the laser treatment on the wafer surface.

Finally, it is proposed that a plurality of plates be stocked and the edges of the plate stock be etched by means of plasma. The edge isolation by means of plasma requires the wafers to be stacked on top of one another. Both the stacking and the handling of the stacks take place either manually or in automated fashion, which involves a very high level of outlay on equipment. Consequently, processing in stacks always involves interrupting or reorganizing the production flow, specifically both in the context of batch production, in which the wafers are transported in process carriers, and in the case of inline production, in which the wafers are passed through the various process steps on conveyor belts or rolls, etc. Furthermore, the complex handling means that the wafers are once again exposed to an increased risk of breaking.

Another process in which only the edges are treated is proposed in DE 100 32 279 A1. DE 100 32 279 A1 describes a process for the chemical passivation of edge defects in silicon solar cells by etching out the edge defects. For this purpose, an etchant is applied to the edges of the silicon solar cells using a felt cloth impregnated with etchant.

Further processes which are known from the prior art solve the problem of the electrically conductive edges by removing the conductive layer on the edges and one side of the substrate by means of etching in an acid bath. By way of example, DE 43 24 647 A1 and US 2001/0029978 A1 describe a multistage etching process in which a substrate is completely immersed in an acid bath. Since it is only the back surface and the edges of the substrate which are being etched here in each case, the front surface of the substrate has to be protected by an acid-resistant photoresist or a mask.

In particular, the etching process described in DE 43 24 647 A1 and US 2001/0029978 A1 is not just time-consuming, since special working steps are required for the application and removal of protective layers, but also requires the use of additional materials. In particular, the application and removal of protective layers entails the risk of the substrates which are to be treated being adversely affected. Should a protective layer applied be defective or damaged, there is a risk of the front surfaces of the substrates being damaged during etching, so that the substrates become unusable.

Therefore, all these processes which have been described in the prior art serve to decouple the two surfaces (top side and underside) in terms of their electrical conductivity, but they involve the in some cases serious problems of the type described above.

BRIEF SUMMARY OF THE INVENTION

The object of the present invention is to provide a process for treating one side of silicon wafers in which it is possible to make do without the process steps of the prior art involving protecting or masking the front surfaces or top sides which are not to be treated, yet the process can preferably be carried out in a production line. The object is accomplished through processes for wet-chemical treatment of one side of a silicon wafer using a liquid bath, during which the wafer lays on conveyor means and the entire surface of the underside to be treated is conveyed through or over liquid located in the liquid bath. In a first embodiment, the conveyor means are positioned within the liquid bath and the top side, which is not to be treated, is always positioned above the liquid. In a second embodiment, the level of the liquid being contacted by the underside is maintained above the level of the bath surface not being contacted by the underside. The top side, which is not to be treated, is always positioned above the level of the liquid.

DETAILED DESCRIPTION OF THE INVENTION

Figure 1:
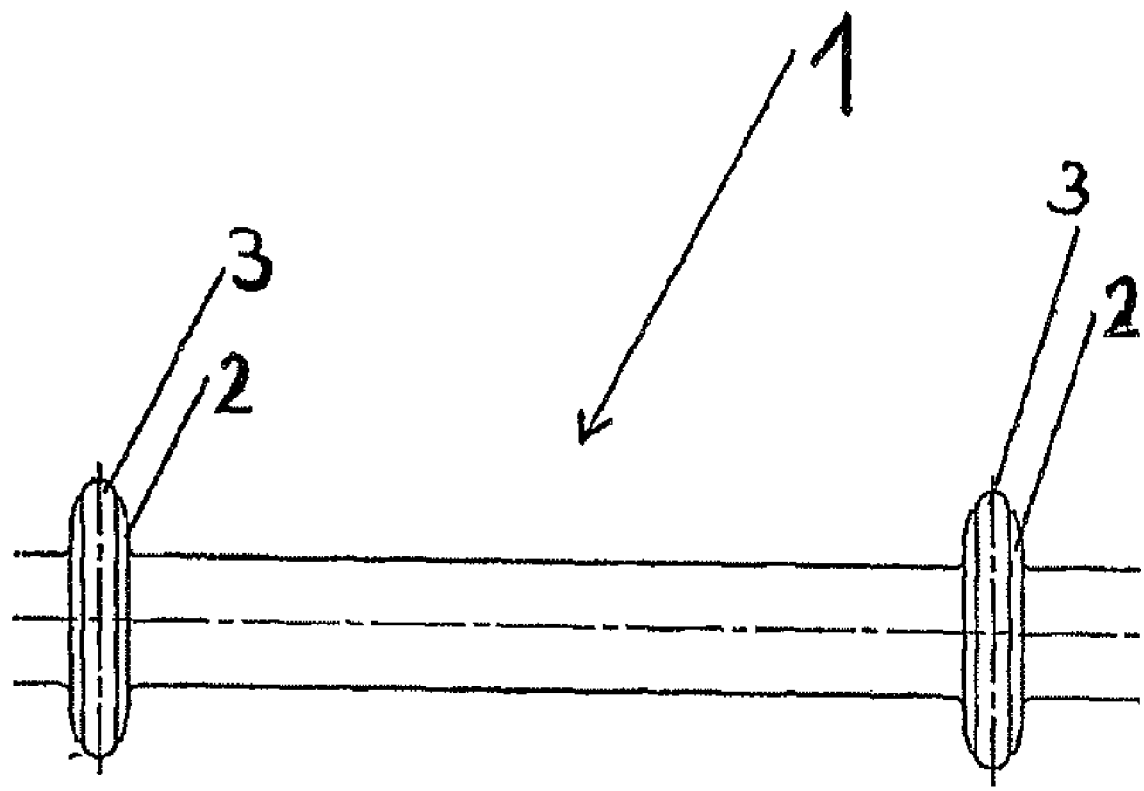
FIG. 1. Conveyor roll for a silicon wafer.

The above object is accomplished through processes for wet-chemical treatment of one side of a silicon wafer using a liquid bath, during which the wafer lays on conveyor means and the entire surface of the underside to be treated is conveyed through or over liquid located in the liquid bath. In a first embodiment, the conveyor means are positioned within the liquid bath and the top side, which is not to be treated, is always positioned above the liquid. In a second embodiment, the level of the liquid being contacted by the underside is maintained above the level of the bath surface not being contacted by the underside. The top side, which is not to be treated, is always positioned above the level of the liquid.

According to the invention, it has been found that it is possible to selectively treat just one of the two surfaces of a substrate. A treatment of one side in this manner comprises, for example, an etching, coating or cleaning of one of the two surfaces. According to one embodiment, it is possible, for example, for just the top side or underside of a corresponding substrate, such as a silicon wafer, to be modified by etching, so that the problem of the formation of short circuits is eliminated in a simple way. To improve understanding, the following text refers to etching of a surface as an example of a treatment of one side of a substrate.

According to a particularly preferred embodiment, the process according to the invention is carried out as part of a continuous processing, in which undersides of the substrates, such as in particular silicon wafers (if desired including the peripheral edges) are wetted with an etching liquid located in a liquid bath.

It should be noted that the process according to the invention is suitable in particular if it is desired or necessary to treat just one side of a substrate. According to a preferred embodiment, the process according to the invention provides for the substrate, preferably in the form of a silicon water, after the phosphorus doping, to be fed to a single-side etch to remove the phosphorus-doped layer. This is effected by virtue of the fact that just one side of the silicon wafer is completely or partially brought into contact with a liquid composition, which preferably contains NaOH, KOH, HF, $HNO_3$, HF with $O_3$, and/or HF with oxidizing agent, such as for example oxidizing acid.

For this purpose, the silicon wafer is oriented substantially horizontally, and the side which is to be etched is wetted with an etching liquid located in a liquid bath. The distance between the etching liquid and the underside of tine silicon wafer is selected to be such that the side of the substrate which is to be etched (if desired including the peripheral edges) is wetted, but the opposite side is not.

It should be noted that this etching step is preferably performed directly after the phosphorus doping, since the phosphorus glass etching is generally carried out by wet-chemical means and the edge isolation according to the invention can then be carried out in the same installation, which saves space and is an inexpensive solution. However, it will be clear to the person skilled in the art that the step according to the invention can also be carried out at other times. The only important factor is that the etch according to the invention should take place prior to the application of the metallic contacts to the back surface or underside of a given substrate.

According to one preferred embodiment of the process according to the invention, both one side of the substrate and the peripheral edges of the substrate can be treated in the manner which has boon outlined above.

According to one embodiment, the substrates are lowered into a liquid bath containing a liquid composition, in which case the extent to which they are lowered can easily be set by the person skilled in the art as a function of the thickness, weight and surface properties of the substrate and the surface tension of the liquid composition. Moreover, by accurate setting of, for example, the level in the treatment bath, it is possible for not just the underside but also the edges to be treated, which is particularly preferred according to the invention.

It will be clear to the person skilled in the art that the treatment according to the invention can be carried out not only by lowering into a liquid bath but also in other ways, provided that it is ensured that it is actually only one side, and if appropriate also the edges, that are wetted by the etchant and modified as a result. By way of example, according to a further embodiment it is possible to provide two vessels of different size, the smaller vessel containing the liquid composition and being surrounded by the larger vessel. The smaller vessel is filled to the brim with the liquid and is fed by virtue of being connected to the larger vessel. This supply of liquid may, for example, take place continuously by means of a pump and can be set in such a way that a certain quantity of the etching liquid always overflows into the outer tank (the larger vessel), the liquid being pumped back from there preferably into the inner tank (the smaller vessel). The pumping of the liquid composition means that the liquid level is always slightly higher than the peripheral edge of the smaller vessel, the difference between the level of the liquid and the height of the container edge being dependent, inter alia, on the surface tension of the etching medium used. Using this arrangement, it is readily possible for the wafers which are to be treated to be conveyed horizontally over the liquid as part of a production line, so that the underside of the wafers is wetted without there being any possibility of the waters banging into the side walls of the smaller inner vessel and being damaged.

Alternatively, it is possible to employ dipping processes, in which case the liquid level in the bath is set to be sufficiently low for the underside of the wafers, if appropriate including the edges, to be wetted only when it is at the lowest point of the dipping curve.

It should be noted that the wetting or treatment of a single side of a substrate which is proposed in accordance with the invention in the embodiments described above can be achieved or assisted in various ways, with a fundamental distinction being drown between active (direct) and passive (indirect) wetting.

In the context of the invention, active or direct wetting is to be understood as meaning that the desired treatment of one side of the substrate is ensured directly by the substrate being passed through the treatment liquid. According to the invention, this requires the level of the substrate underside which is to be treated to be at least for a brief period below the maximum level of the treatment liquid. In the context of active wetting, by way of example, the substrate can be lowered into the liquid or the level of the liquid in the tank can be completely or partially raised, the invention also encompassing a combination of lowering of the substrate and raising of the level of the liquid.

By way of example, the surface of the bath can be locally raised by a correspondingly arranged and directed liquid inlet below the surface at the location at which the substrates are introduced into the bath. Furthermore, the bath surface can be partially raised by blowing in gas bubbles below the substrate, e.g. using compressed air, so that it is likewise possible to ensure wetting of the substrate underside.

By contrast, in the context of the invention passive or indirect wetting is to be understood as meaning that the underside of the substrate which is to be treated is above the level of the liquid throughout the entire duration of the treatment, and consequently wetting is effected only indirectly by means of components of the system which for their part are in contact with the liquid and are responsible for welling the substrate undersides. In this context, it should be noted that the substrate side which is to be treated needs to be wetted either completely (over its entire surface) or just partially through contact with the component responsible for the welling, since the hygroscopic properties of the surface of silicon wafers ensure that even partial wetting of the underside by a component leads to wetting of the entire surface within a very short time.

With regard to the components which can be provided for the indirect wetting, it should be noted that these may either form part of the conveyor system explained above or may be arranged in the liquid bath, in such a manner that they at least in part project out of or can be extended out of the liquid. Accordingly, according to the invention fixed, rotating or vertically displaceable components are equally suitable. It is preferable for the surface property and/or shaping (e.g. by exploiting a capillary effect) of the component to ensure that its region which is intended to come into contact with the substrate underside is wetted and effects the wetting of the surface to be treated without the substrate itself coming into contact with the liquid bath. By way of example, the component may be a wetting roller which rotates in the liquid of the bath and, as a result of the rotary motion, takes up etching liquid, with which the substrate undersides located above the level are then wetted. As has already been explained, it is, however, also possible, in accordance with the invention, to use components of other configurations, such as (vertically displaceable) tables, pins or rams, since surprisingly even punctiform contact with the substrate underside is sufficient to ensure wetting of the entire surface.

The use of a conveyor system for guiding the substrates which are to be treated as part of the process according to the invention in principle allows both active and passive wetting. In the case of active wetting, the substrate to be treated is guided through the liquid, whereas passive wetting is effected by correspondingly configured components of the conveyor system.

The suitability of examples of conveyor systems in accordance with the invention is explained in more detail below with additional reference to FIG. 1.

According to one embodiment of the present invention, the substrates are laid on a conveyor system, such as for example a roller conveyor system. In this case, the substrates are conveyed with the aid of a plurality of conveyor rolls (1) arranged one behind the other and oriented horizontally. In the context of the active wetting as defined above, the individual conveyor rolls are preferably arranged in such a manner in a liquid bath that in each case the upper edge of the rolls is located approximately at the level of the bath surface, i.e. of the upper edge of the liquid, so that the underside of the substrate is wetted through direct contact with the bath surface. In this case, a meniscus may form at the substrate edges. The interplay of gravity and surface tension then draws the substrate downward and ensures that it remains in contact with the rolls without floating. This allows controlled and defined conveying of the substrates using the roll conveyor system.

In this context, it is important that it be possible for the height of the liquid bath to be set so accurately with respect to the conveyor system that it is possible for the underside and if appropriate the edges of the substrates to be wetted without the top sides of the substrates also being wetted. Also, the configuration of the conveyor system must allow contact between the substrates and the liquid in the liquid bath.

According to a particularly preferred embodiment, there are at least two support elements (3), which may advantageously be disposed on the conveyor roll in the region of two grooves (2), present on the conveyor roll (1). The distance between the support elements is predetermined by the width of the substrates which are to be treated. In the context of the active wetting, the above statements relating to the positioning of the conveyor rolls in this embodiment apply to the support elements.

In the context of the passive wetting as defined above, the conveyor rolls themselves or the support elements are responsible for complete or partial wetting of the substrate undersides.

The conveyor roll is preferably of at least two-part structure, comprising an axle element and at least one track element surrounding the axle element. The axle element may function either purely as a stabilizer or as a stabilizing bearing. It is preferably a bearing axle. The material of the axle, which does not come into contact either with the material being conveyed or with a chemical environment which may under certain circumstances be aggressive, can be selected purely on the basis of mechanical and thermal aspects. According to the invention, it is flexurally rigid. By contrast, the track element is permitted certain thermal tolerances on account of the stabilizing bearing axle. The crucial factor for the material is that it does not react either with the piece material or with the ambient medium. The flexurally rigid bearing axle ensures that the material being conveyed is held on a stipulated straight line in the direction perpendicular to the conveying direction. As a result, the conveyor roll runs synchronously over its entire length, which is important in particular in the case of relatively wide conveyor rolls with a plurality of conveyor tracks and for flat material being conveyed which is sensitive to fracturing.

In one preferred embodiment, the axle element is made from a carbon fiber composite. Carbon fiber composites have a high thermal and mechanical stability and are therefore particularly suitable for use as bearing axles employed at fluctuating temperatures.

In one preferred embodiment, the bearing axle is encapsulated, for example by sealing rings, with respect to the medium which is used to treat the material being conveyed. The medium, which according to the invention is a wet-chemical bath, then only comes into contact with the exterior of the track elements and the liquid medium cannot penetrate into the interior of the track elements, onto the bearing axle or onto any fixing elements which may be present between bearing axle and track elements. The seal may be liquid-tight or may even be designed to a certain degree to be gas tight, so that it is also impossible fox harmful vapors to penetrate into the interior of the track elements.

The track elements can be assembled in any desired length, and a conveyor roll may, for example, comprise an axle with any desired number of track elements. A conveyor roll manufacturer or supplier can meet customer requirements very flexibly without having to employ complicated stock management. The track element, since it con be used for conveyor rolls of any length, is a mass-produced article, which reduces its production costs.

The track elements can, for example, be plugged together, screwed onto one another, connected using a clip or welded to one another.

In a preferred embodiment, the substrate to be treated is actually supported on support elements (3) with static friction properties which are suitable for the workpiece, in which case the support elements, as mentioned, can be used not only for conveying but also for passive wetting. These elements should likewise be thermally and chemically stable. The use of O rings made from fluorinated rubber has proven suitable for the production of solar cells. Since the diameter spanned by the support elements is greater than the remainder of the track element, the material being conveyed experiences only punctiform contact and if appropriate wetting. This, unlike linear contact, is gentle on the material being conveyed and at the same time ensures good contact with the surrounding medium.

In a further advantageous embodiment, the track element is made from plastic. It is known that plastic is easy to process and offers a wide range of different properties which are selected according to the use and deployment location of the conveyor roll. By way of example, it has proven expedient to use polyethylene, polyfluoroalkoxide or polyvinylidene fluoride. These materials are thermally stable up to oven 80 degrees Celsius, are weldable, have a certain chemical stability, do not cause any metal contamination and are relatively unabraidable.

An advantageous refinement of the invention consists in track elements being driveable, i.e. it is possible for the drive to be applied not to the bearing axle and then transmitted from the latter to the track elements, but rather for it to act directly on the track elements. Conveyor rolls having track elements of this type can be assembled to form particularly synchronous conveyor systems. Optimum traction is transmitted to the material being conveyed.

In one embodiment, of an assembled series of track elements, a first edge element has means for transmitting the driving force and a second edge track element has means for rotatable bearing. The drive can be transmitted to the conveyor roll via a coupling element, which is fitted to a drive shaft and can be connected to the first edge track element. The coupling element also has a means for holding the bearing axle. If a conveyor roll is to be removed from a conveying position, first of all the second edge track element has to be released from the bearing, the entire conveyor roll has to be pivoted about the coupling element and then the conveyor roll has to be removed from the coupling element.

The means for rotatable bearing may comprise an upper and a lower half-shell, the lower halt-shell being fixed to the wall of the conveyor system and being used to support the conveyor roll, and the second, upper half-shell being releasably secured for retaining purposes.

The width of the track element advantageously corresponds to at least the width of the workpiece to be conveyed, so that the wide side of a workpiece rests on just one track element. It is preferable for each track element to receive just one workpiece, i.e. for the widths of track element and material being conveyed to be virtually equal.

In an advantageous embodiment of the conveyor roll, a fixing ring is fitted to the bearing axle, the internal diameter of a track element at least at one location being smaller than the diameter of the fixing ring. The fixing ring therefore prevents the possibility of a track element executing greater movements on the bearing axle. This is important in particular in the event of temperature changes, if the material of bearing axle and track elements expands differently, which could cause them to move relative to one another.

The fixing ring is preferably made from metal, since metal can be successfully bent onto the axle and clamped in place there.

For use at different temperatures, slight changes in length should have no adverse effect on the stability of the conveyor roll as a whole. Therefore, in a further advantageous embodiment of the invention, the track elements are provided with a compensation crease at which thermal expansions are compensated for. The compensation crease generally comprises an inner hollow convexity in the material of the track element, which absorbs the temperature-induced material expansion by stretching in the longitudinal direction. If the compensation crease is not located between the support points of the material being conveyed, the stability of support remains stable even in the event of temperature-induced changes in length. If, moreover, the track elements are in each case fixed to the bearing axle, the rectilinear nature of the track is also retained.

Uniform guidance of the material being conveyed is ensured particularly successfully if conveyor rolls according to the invention are assembled to form a conveyor system.

In one preferred refinement of the conveyor system, each conveyor roll is driven. In this case, each conveyor roil is subject to the same transmission of force and is therefore also subject to equal loads.

Since the conveying guidance provided by the conveyor system proposed according to the invention allows a high throughput and at the same time is very gentle on the material being conveyed, it is particularly suitable for use in the context of the process according to the invention.

It should also be noted that it is possible to use alternative embodiments of conveyor systems which do not employ conveyor rolls. By way of example, substrates can also be conveyed on a rotating belt, a chain or also cords. A further conveying option in a conveyor system is formed by a traveling bar. This system uses two or more bars which alternately convey the substrates forward. While a first bar is moving forward, a second bar moves backward. In this case, the second bar lies deeper in the liquid bath and is not in direct contact with the substrate. When the first or upper bar has reached the end of its possible conveying movement and the second or lower bar has reached its start, the lower bar is raised, so that the substrates come into contact with both bars. The upper bar is then lowered and can therefore move back to the start of the liquid bath, while the lower bar is executing a forward movement.

In conventional designs of a bar conveyor system of this type, the bars are mounted on rotating shafts with an eccentric, i.e. they are constantly moving up and down. However, to ensure treatment of one side of substrates, the substrates, in the context of active wetting, must always remain at the same height. Corresponding modifications to a conventional bar conveyor system and its use in the context of the passive wetting as defined above are, however, immediately apparent to a person skilled in the art having knowledge of the present description.

Therefore, the process according to the invention can particularly advantageously be carried out in a once-through installation, since in the context of an inline production of this type there is no need for any additional handling step for the wafers. Furthermore, the back surface/edge isolation according to the invention can be carried out together with the oxide etching in the same installation, making the process sequence simpler and less expensive. Furthermore, by using the process according to the invention it is also possible to realize cell concepts in which the back surface of the cell docs not have a full-area "aluminum back surface field" (AlBSF). Since in the process according to the invention the n doped layer on the back surface of the cell is completely removed, it is no longer imperative that this doping be compensated for by forming an AlBSF in order to form a p-doped zone. This leaves open more options with regard to the configuration of the back surface of the cell and simplifies realization of cell concepts without AlBSF.

Depending on the particular process (continuous or discontinuous), the liquid composition may require additives, for example to avoid or reduce the size of gas bubbles, in which case additives of this type can be selected by the person skilled in the art without difficulty on the basis of the specific requirements. When selecting suitable additives, in particular in the once-through process, it should be ensured that the wafers do not acquire excessive buoyancy as a result of possible formation of gas bubbles, which could have an adverse effect on efficient conveying, since the wafers may lose contact with a corresponding conveyor means as a result. Consequently, according to a preferred embodiment it is proposed that the etching solution contain at least one additive which is able to substantially bind the gases termed during the chemical reaction, so that the formation of gas bubbles on the underside of the wafers is substantially suppressed.

It should be noted that the process according to the invention can be employed not only for the electrical isolation of the two sides of wafers or solar cells, but is also suitable for carrying out other wet-chemical treatments in which treatment of one side of a substrate with a liquid medium is required or desired, such as for example in the case of cleaning and coating.

What is claimed is:

1. A process for wet-chemical treatment of one side of a silicon wafer using a liquid bath, during which treatment the silicon wafer lays on conveyor means and the entire surface of the underside to be treated is conveyed through or over liquid located in the liquid bath, wherein the conveyor means are positioned within the liquid bath, further wherein the top side which is not to be treated is always positioned above the liquid, further wherein a meniscus is positioned at edges of the wafer.

2. The process as claimed in claim 1, characterized in that the silicon wafer is processed continuously in a once-through process.

3. The process as claimed in claim 2, characterized in that the underside of the silicon wafer is lowered into the liquid bath.

4. The process as claimed in claim 1, characterized in that as part of a production line the silicon wafer is conveyed horizontally through the treatment liquid located in the liquid bath.

5. The process as claimed in claim 4, characterized in that the liquid bath used is a tank whose peripheral edge is lower than the level of the treatment liquid.

6. The process as claimed in claim 1, characterized in that the edges of the silicon wafer are also treated.

7. The process as claimed in claim 1, characterized in that the treatment is an etching step and is carried out in a liquid composition which contains NaOH, KOH, HF, $HNO_3$, HF with $O_3$, and/or HF with oxidizing agent.

8. The process as claimed in claim 7, characterized in that the oxidizing agent is an oxidizing acid.

9. The process as claimed in claim 8, characterized in that the liquid composition contains at least one additive for binding the gases formed during the etching.

10. The process as claimed in claim 7, characterized in that the liquid composition contains at least one additive for binding the gases formed during the etching.

11. The process as claimed in claim 1, characterized in that the conveyor means are provided in the form of belts or conveyor rolls.

12. The process as claimed in claim 1, characterized in that the treatment is an etching, coating or cleaning step.

13. The process as claimed in claim 1, characterized in that the top side of the wafer is not protected during treatment.

14. A process for wet-chemical treatment of one side of a silicon wafer using a liquid bath, during which treatment the wafer lays on conveyor means and is conveyed with the underside to be treated through or over liquid located in the liquid bath, wherein the level of the liquid being contacted by the underside is maintained above the level of the bath surface not being contacted by the underside as a result a meniscus forms between the underside and a surface of the liquid in the liquid bath, further wherein the top side which is not to be treated is always positioned above the level of the liquid.

15. The process as claimed in claim 14, characterized in that the underside of the silicon wafer is lowered into the liquid bath over the production line.

16. The process as claimed in claim 14, characterized in that the silicon wafer is conveyed horizontally through the treatment liquid located in the liquid bath over a production line.

17. The process as claimed in claim 16, characterized in that the liquid bath used is a tank whose peripheral edge is lower than the level of treatment liquid.

18. The process as claimed in claim 14, characterized in that the conveyor means are provided in the form of belts or conveyor rolls.

19. The process as claimed in claim 18, characterized in that the conveyor rolls are in each case arranged on axle elements.

20. The process as claimed in claim 19, characterized in that each axle element is encapsulated in a fluid-tight manner with respect to the treatment liquid.

21. The process as claimed in claim 14, characterized in that the edges of the silicon wafer are also treated.

22. The process as claimed in claim 14, characterized in that the silicon wafer is processed continuously in a once-through process.

23. The process as claimed in claim 10, characterized in that the treatment is an etching, coating or cleaning step.

24. The process as claimed in claim 23, characterized in that the etching liquid is carried out in a liquid composition which contains NaOH, KOH, HF, $HNO_3$, HF with $O_3$, and/or HF with oxidizing agent.

25. The process as claimed in claim 24, characterized in that the oxidizing agent is an oxidizing acid.

26. The process as claimed in claim 14, characterized in that the top side of the wafer is not protected during treatment.

27. A process for wet-chemical treatment of electrically conductive edges of a silicon wafer using a liquid bath, during which treatment the silicon wafer lays on conveyor means, wherein the underside and electrically conductive edges to be treated are conveyed through or over etching liquid located in the liquid bath to remove conductivity from the edges, further wherein the conveyor means are positioned within the liquid bath, further wherein an electrically conductive top side which is not to be treated is always positioned above the liquid, further wherein a meniscus is positioned at edges of the wafer.

* * * * *